(12) United States Patent
Adams et al.

(10) Patent No.: US 7,003,704 B2
(45) Date of Patent: Feb. 21, 2006

(54) TWO-DIMENSIONAL REDUNDANCY CALCULATION

(75) Inventors: R. Dean Adams, St. George, VT (US); Thomas J. Eckenrode, Endicott, NY (US); Steven L. Gregor, Endicott, NY (US); Garrett S. Koch, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 491 days.

(21) Appl. No.: 10/292,359

(22) Filed: Nov. 12, 2002

(65) Prior Publication Data

US 2004/0093540 A1 May 13, 2004

(51) Int. Cl.
*G11C 29/00* (2006.01)

(52) U.S. Cl. .................... 714/711; 714/718
(58) Field of Classification Search ............... 714/7, 714/720, 733, 739, 710, 711, 718
See application file for complete search history.

(56) References Cited

U.S. PATENT DOCUMENTS

| | | | |
|---|---|---|---|
| 4,603,404 A | 7/1986 | Yamauchi et al. | |
| 4,639,915 A | 1/1987 | Bosse | |
| 4,751,656 A | 6/1988 | Conti et al. | |
| 4,768,193 A | 8/1988 | Takemae | |
| 4,947,375 A | 8/1990 | Gaultier et al. | |
| 5,058,069 A | 10/1991 | Gaultier et al. | |
| 5,337,318 A | 8/1994 | Tsukakoshi et al. | |
| 5,577,050 A | 11/1996 | Bair et al. | |
| 5,764,878 A * | 6/1998 | Kablanian et al. | 714/7 |
| 5,795,797 A | 8/1998 | Chester et al. | |
| 5,809,225 A | 9/1998 | Ohsawa et al. | |
| 5,859,804 A | 1/1999 | Hedberg et al. | |
| 6,026,505 A | 2/2000 | Hedberg et al. | |
| 6,091,650 A | 7/2000 | Ferrant | |
| 6,256,757 B1 | 7/2001 | Arkin | |
| 6,259,637 B1 | 7/2001 | Wood et al. | |
| 6,286,116 B1 * | 9/2001 | Bhavsar | 714/720 |
| 6,304,989 B1 * | 10/2001 | Kraus et al. | 714/733 |
| 6,310,807 B1 | 10/2001 | Ooishi et al. | |
| 6,769,084 B1 * | 7/2004 | Kim et al. | 714/739 |

OTHER PUBLICATIONS

Dewar, "Method to Identify Defective, Testable, Redundant Lines in Memory Arrays", IBM Technical Disclosure Bulletin, vol. 34, No. 10B, Mar. 1992, pp. 214-215.

Bertin, et al., "Low-Power Dynamic Random-Access Memory Using On-Chip Error Correction and Refresh Control", IBM Technical Disclosure Bulletin, vol. 34, No. 10B, Mar. 1992, pp. 217-218.

* cited by examiner

*Primary Examiner*—David Ton
(74) *Attorney, Agent, or Firm*—Scully, Scott, Murphy & Presser; Richard Henkler, Esq.

(57) ABSTRACT

A system and methodology for testing memory in an integrated circuit implementing BIST testing to calculate row and column redundancy and enable replacement of a defective row or column of memory cells. The system comprises circuitry for detecting a first single memory cell failure in a row; and, recording the I/O value of the first Single Cell Fail (SCF). A circuit is provided for detecting whether more than one single cell failure has occurred for a tested row, and, in response to detecting a second SCF, comparing recorded I/O value of the subsequent tested row, with the I/O value associated with the first failed memory cell. Upon detection of defective bits, the defective column and row of memory having corresponding defective bits set is replaced.

13 Claims, 4 Drawing Sheets

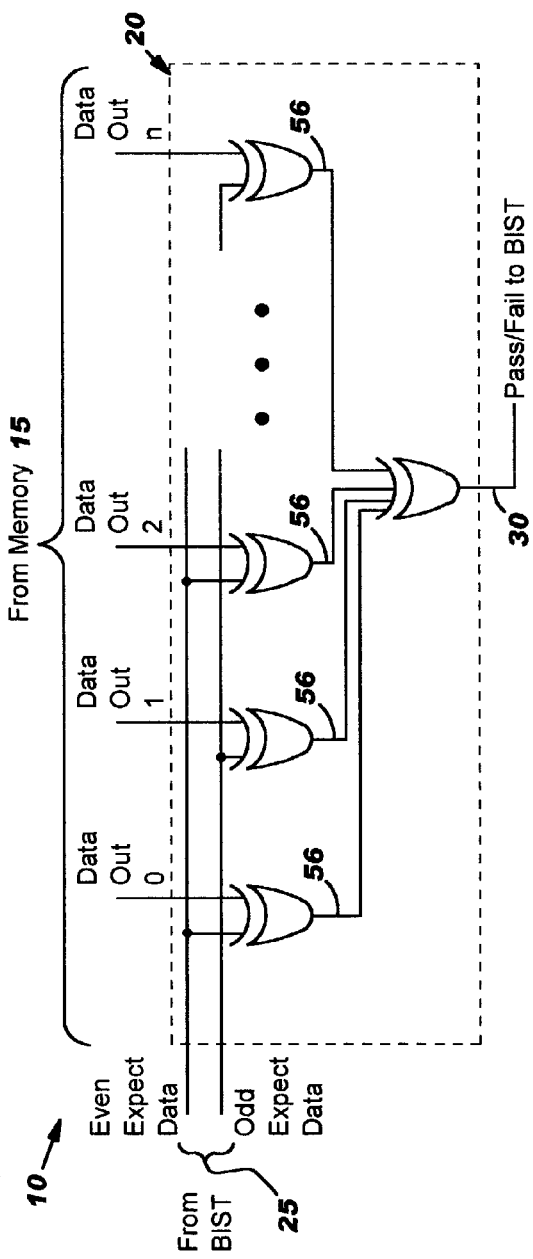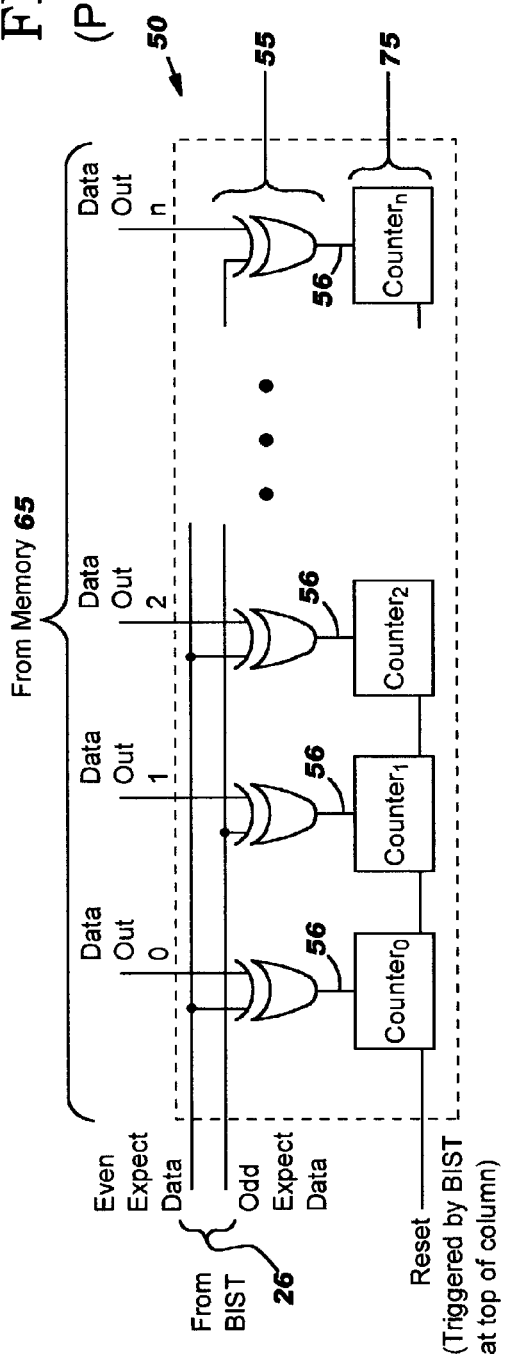

TWO-DIMENSIONAL REDUNDANCY CALCULATION

BACKGROUND OF THE INVENTION

1. Field of the Invention

The present invention relates to semiconductor memory devices employing Built-In-Self-Test (BIST), and particularly, to a novel BIST system and method for calculating redundancy for a two-dimensional redundancy scheme.

2. Description of the Prior Art

Redundancy is required on all large semiconductor memories to ensure adequate chip yield. Memories are very dense circuits and are sensitive to subtle defects to which logic circuits are immune. Thus yield is improved by including redundant elements to replace defective memory portions. As an example, it is not unusual for a chip yield to be 25% without redundancy, 50% with row redundancy, and 70% with two-dimensional (row and column) redundancy. Further, it is not unusual to see very low yields with insufficient redundancy, sometimes below 1%.

Most memories today are embedded so that the memory inputs and outputs (I/O) do not come to the chip I/O. For these memories built-in self-test (BIST) is employed to do the testing and also calculate the needed redundancy replacement. Calculating redundancy replacement is easy on stand-alone memories since all the failing locations can be recorded at the tester followed by selection of optimal redundancy implementation. When BIST is employed, as is required in microprocessors and ASICS, the redundancy calculation must be determined on the fly since there is insufficient space to store all the failing locations prior to selecting the redundancy implementation.

Most SRAMs with redundancy have only had a single dimension of redundancy that is implemented with spare rows. When a failure is seen during test on a given word, the row which that word is part of gets replaced with a redundant row. That way all words which are in that row are replaced. This works well with BIST since a single pass/fail signal can be sent back from the memory to the BIST on each read.

FIG. 1 depicts an example BIST pass/fail compare circuit 10 including a simple XOR-OR tree 20 that functions to compare the memory word (e.g., 72-bits) output from a row of memory 15 with the expected data output from the BIST 25. This is accomplished local to the memory 15 and the resulting pass/fail signal generated by the tree 30 is sent back to the BIST 25, where the redundancy calculation is stored.

Two-dimensional redundancy has been implemented on DRAMs, SRAMs, and CAMs when required, but is not widely utilized unless absolutely needed, due to the required overhead. FIG. 2 illustrates an example BIST pass/fail compare circuit 50 including an XOR tree 55 that functions to compare the memory word (e.g., 72-bits) output from a row of memory 65 with the expected data output from the BIST 26. This prior art BIST pass/compare scheme however, includes added counter devices 75, that, on a per bit basis, enable a column redundancy calculation. That is, when a failure is encountered, where column redundancy is available, the bit location within the word is determined. Thus, for a 72-bit word, for example, the results 56 of each of the 72 bit comparisons are accumulated across multiple reads, requiring the counters 75 shown in FIG. 2 in addition to the OR circuitry shown in FIG. 1. These counters 75 are then unloaded to determine the correct redundancy implementation after reaching the top of the columns being tested. Obviously, the amount of circuit overhead to implement these many counters 75 (e.g., approximately 4700 cells for the needed counters and associated clock splitters, etc.), along with the logistical problem of unloading the counters before continuing the BIST testing, create challenges.

Another alternative is to unload each fail to an external tester so that the tester can calculate the redundancy. This requires much more test time since the information must be sent off chip for each fail. It also decreases the test quality by having to stop test for each fail rather than providing back-to-back at-speed tests. The other alternative is to accumulate fails along a column with a counter to determine when column redundancy is required. This requires much more space on chip and requires that the result be implemented prior to determining proper row redundancy.

SUMMARY OF THE INVENTION

It is an object of the present invention to provide a large semiconductor memory with BIST implementing two-dimensional redundancy that takes up less chip area and simplifies the required interaction with BIST.

In accordance with the invention, there is provided a system and methodology for testing memory in an integrated circuit implementing row and column redundancy for enabling replacement of a defective row and/or column of memory cells. The system comprises circuitry for testing rows of memory cells in the memory for detecting for a first single memory cell failure in a row and, an encoder device for determining a bit location of a first single memory cell failed and generating and storing, in a register, an encoded value representing the bit location of the detected failed memory cell. A circuit is provided for detecting whether more than one single cell failure has occurred for a tested row, and, in response to detecting more than one single cell failure for a tested row, the circuit generates a bit indicating that tested row as a defective row to be replaced. Further included is circuitry for comparing the encoded value of the location determined for a failed memory cell detected in a subsequent tested row, with the stored encoded value associated with the first single memory cell failed, and generating a bit indicating defective column to be replaced when the encoded bit value location for a failed memory cell of that subsequent row is equal to the stored encoded value associated with the first single memory cell failed. Given the indication of defective bits, the defective column corresponding to the encoded bit location of the detected failed memory cell and the defective row of memory is replaced.

It is understood that if no more than a first single cell failure has occurred for a tested row and no bit indicating a defective column to be replaced has been set, then either the row or column of memory that includes that first single memory cell failure is replaced.

Preferably, a failed address register is implemented for storing the address of the row upon detection of a first single memory cell failure, in addition to the encoded failing bit value.

BRIEF DESCRIPTION OF THE DRAWINGS

Preferred embodiments of the invention will now be described, by way of illustrative and non-limiting examples, with reference to the accompanying drawings in which:

FIG. 1 depicts an example BIST pass/fail compare circuit including a simple XOR-OR tree that functions to compare the memory word output from a row of memory with the expected data output from the BIST;

FIG. 2 illustrates an example BIST pass/fail compare circuit including an XOR tree that further includes a counter device for each bit of a row, that on a per bit basis, calculates column redundancy;

DETAILED DESCRIPTION OF THE INVENTION

The present invention is a two-dimensional memory redundancy calculation scheme that provides for a radical reduction in the amount of circuitry required to perform the column redundancy calculation, simplifies the calculation process, and reduces test time.

Figure 3:
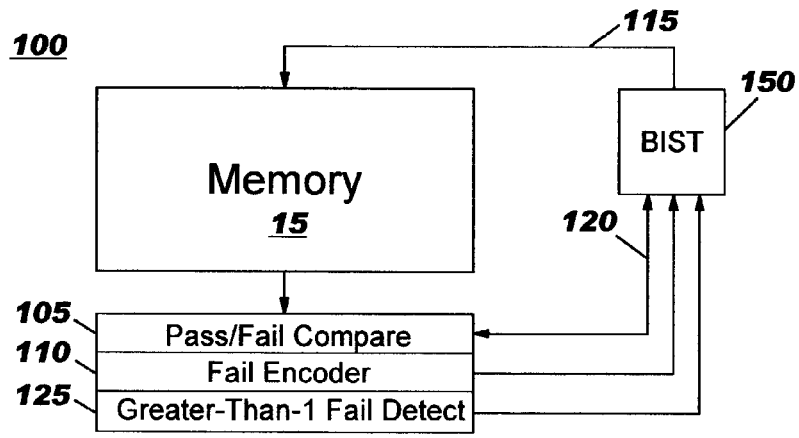
FIG. 3 illustrates a high level view of the two-dimensional redundancy calculation system 100 according to the present invention.

FIG. 3 illustrates a high level view of the two-dimensional redundancy calculation system 100 according to the present invention. As shown in FIG. 3, the system components include a normal pass/fail compare circuit 105 which may comprise, for example, the row pass/fail circuitry 20 of FIG. 1, a fail encoder device 110, and a greater-than-one fail detect circuit 125. Each of these components interact with memory 115 and, as shown in FIG. 3, may be separate from the BIST circuitry 150, or, as will be described in greater detail herein, may be integrated within the BIST 150. Particularly, the BIST 150 provides data, address, and control inputs 115 to the memory 15. The BIST additionally includes connection 120 with the pass/fail compare circuit 105, for example, in order to provide expect data 25, 26 to the pass/fail compare circuits 105, or to receive feedback in the form of a pass/fail indication to the BIST. All of this is standard for memory and BIST combinations. For example, the feedback from the pass/fail compare to the BIST is standard for memories with row redundancy. In view of FIG. 3, instead of having a counter at the output of each bit as shown in the prior art redundancy calculation of FIG. 2, a greater-than-one fail detect circuit 125 is included at the output of the whole memory which is implemented to detect a Single Cell Fail ("SCF") in a memory column. For a single cell fail (SCF), the bit value is encoded and sent back to the BIST. As will be described in greater detail herein, if more than a SCF is encountered, then the greater-than-I signal is activated and sent back to the BIST and the encoded value is ignored. For a SCF within a word, the encoded value determines any column redundancy location which would need be implemented. If the greater-than-I signal is active that means that a row element should be implemented for redundancy.

Figure 4:
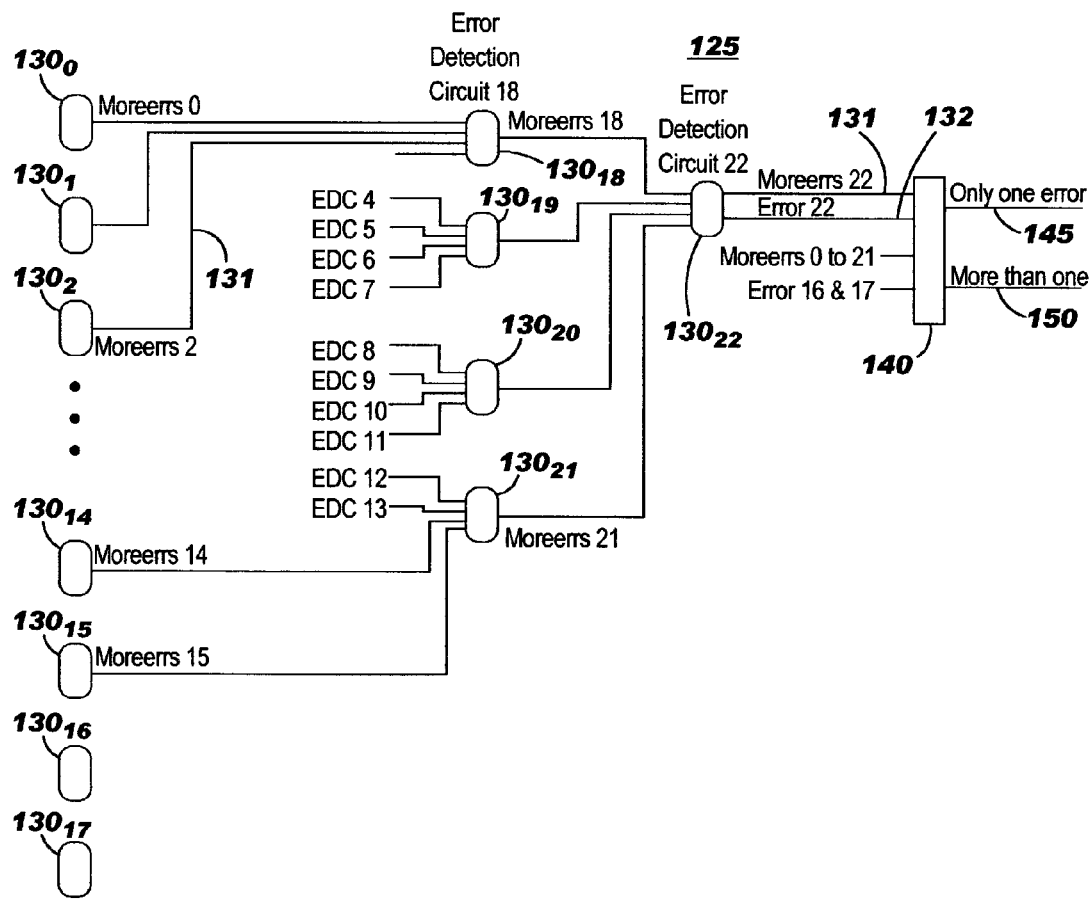
FIG. 4 illustrates one embodiment of the greater-than-one fail detect circuit for determining if there exists more than a single memory cell failure in a tested row of memory, for instance, a row comprising 72 bits.
Figure 5A:
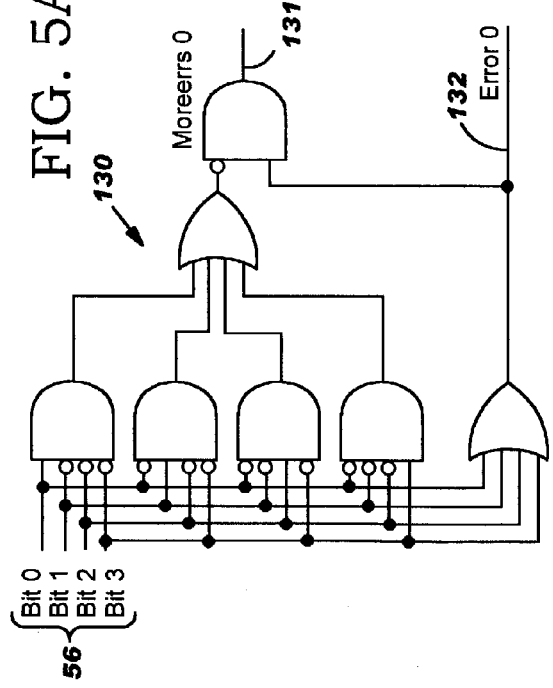
FIG. 5(a) is a detailed circuit schematic illustrating the error detect circuit 130 provided in error detection circuit devices $130_0$ to $130_{22}$ of the greater-than-one fail detect circuit 125.
Figure 5B:
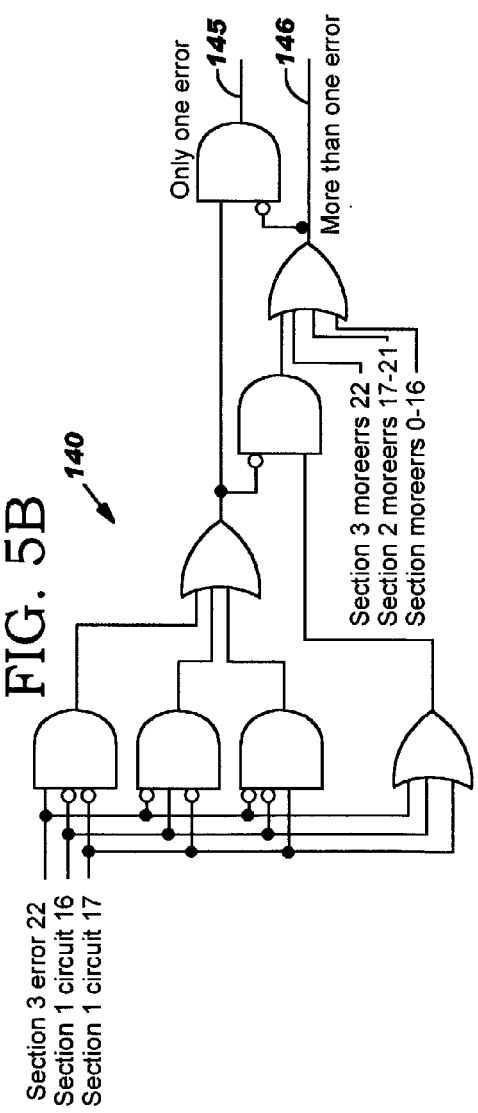
FIG. 5(b) is a detailed circuit schematic illustrating the final section 140 of the error detect circuit of the greater-than-one fail detect circuit 125.

FIG. 4 illustrates one embodiment of the greater-than-one fail detect circuit 125 for a single column in a memory, for instance, a memory column comprising 72 bits. As shown in FIG. 4, the greater-than-one fail detect circuit 125 for a single column includes a plurality of error detection circuit devices $130_0$ to $130_{22}$ organized as a tree structure implementing logic to detect if more than one failure exists in a given column. Each of the error detection circuit devices $130_0$ to $130_{22}$ of greater-than-one fail detect circuit 125 comprises an error detect circuit 130 as shown in FIG. 5(a). In FIG. 5(a), an error detection circuit device 130 receives four (4) logic signals and implements a combination of logic AND and OR gates for determining the presence of an error or more than one error. With respect to a first section of error detection circuit devices $130_0$ to $130_{17}$ each of these circuits receive four bits from the XOR circuitry output comparison results 56 from the column detect circuitry shown in FIG. 1, totaling, in the example implementation described herein, 72 bits. The AND/OR gate logic implemented in each error detection circuit devices $130_0$ to $130_{17}$ results in an output 131 indicating either detection of an error in the memory column, or an output 132 indicating no error. Returning to FIG. 4, the output signals 131 from each of the devices $130_0$ to $130_{15}$ of the first section are input to a second section of the greater-than-one fail detect circuit 125 comprising error detection circuits $130_{18}$ through $130_{21}$. For instance, the four logic outputs 131 from respective error detection circuits $130_0$ to $130_3$ are input to error detection circuit $130_{18}$. The four logic outputs 131 from respective error detection circuits $130_{18}$ to $130_{21}$ are input to a third section of the greater-than-one fail detect circuit 125 comprising error detection circuit $130_{22}$. FIG. 5(b) illustrates a final section of the error detect circuit of the greater-than-one fail detect circuit 125 comprising final error detect circuit 140 which receives outputs 131,132 from error detection circuit $130_{22}$ in addition to signal outputs 131 from each of the error detect circuits $130_0$ to $130_{22}$. The resulting output of the greater-than-one fail detect circuit 125, which is output from the final error detect circuit 140, comprises a signal 145 indicating presence of only one error in a memory column, or a signal 146 indicating more than one error in a column. Thus, if any bits in the column pass/fail circuit (FIG. 2) are set to a one, indicating presence of an error, the greater-than-one fail detect circuit 125 will detect it, and the only one error line 145 (FIG. 4) will be turned on. If more than one bit in the column pass/fail circuit are set to one indicating more than one error in a column, then the more than one error line 146 will be set.

Returning to FIG. 3, there is illustrated the fail encoder circuit 110 which comprises an encoder device for determining which column produced the error. Particularly, for an example embodiment implementing 72 columns in a memory, the pass/fail column error detect circuit 105 will provide the number of the column having the detected error to an encoder device. The fail encoder device 110 implements logic for encoding that number, e.g., a 72 bit word (having bits set according to the detected column(s) error) into a seven (7) bit word. Skilled artisans may device any encoding scheme for representing a large word, e.g., 72 bits, as a smaller word, e.g., 7 bits. For example, in FIG. 3, if memory column 12 of the 72 columns produced a failed bit out of the pass/fail compare circuit 105, the encoder will encode the 72 bit into a 7 bit word '0001100', having a value of 12. It should be understood that if more than one column has a detected failure, e.g., columns 12 and 16, then the 7-bit encoded word out of the fail encoder may be set to '0011100'. However, as the BIST will interpret this as a single failure of column 28, the more than one error fail signal 146 out of the greater-than-one fail detect circuit 125 will indicate to the BIST that that value is erroneous and that the actual failure consisted of more than one column that could not be fixed. The failed address is stored, for example, in a failed address register as a word, however, the more than one error fail signal 146 will additionally be stored to notify the BIST.

The greater-than-one fail detect circuit 125 tree configuration of FIG. 4 obviates the need for a counter device at each bit for a column as in FIG. 2 of the prior art, and significantly reduces the amount of devices and circuitry. For instance, the fail encoder 110 and the greater-than-one circuit 125 requires approximately 1388 cells or less. This total of under 1400 cells is significantly less than the prior art configurations of FIG. 2. Furthermore, the greater-than-one fail detect circuit 125 tree configuration enables detection of column errors on the fly, rather than having to run the test and scan out all of the counters after a test run, as in the prior art of FIG. 2.

Figure 6:
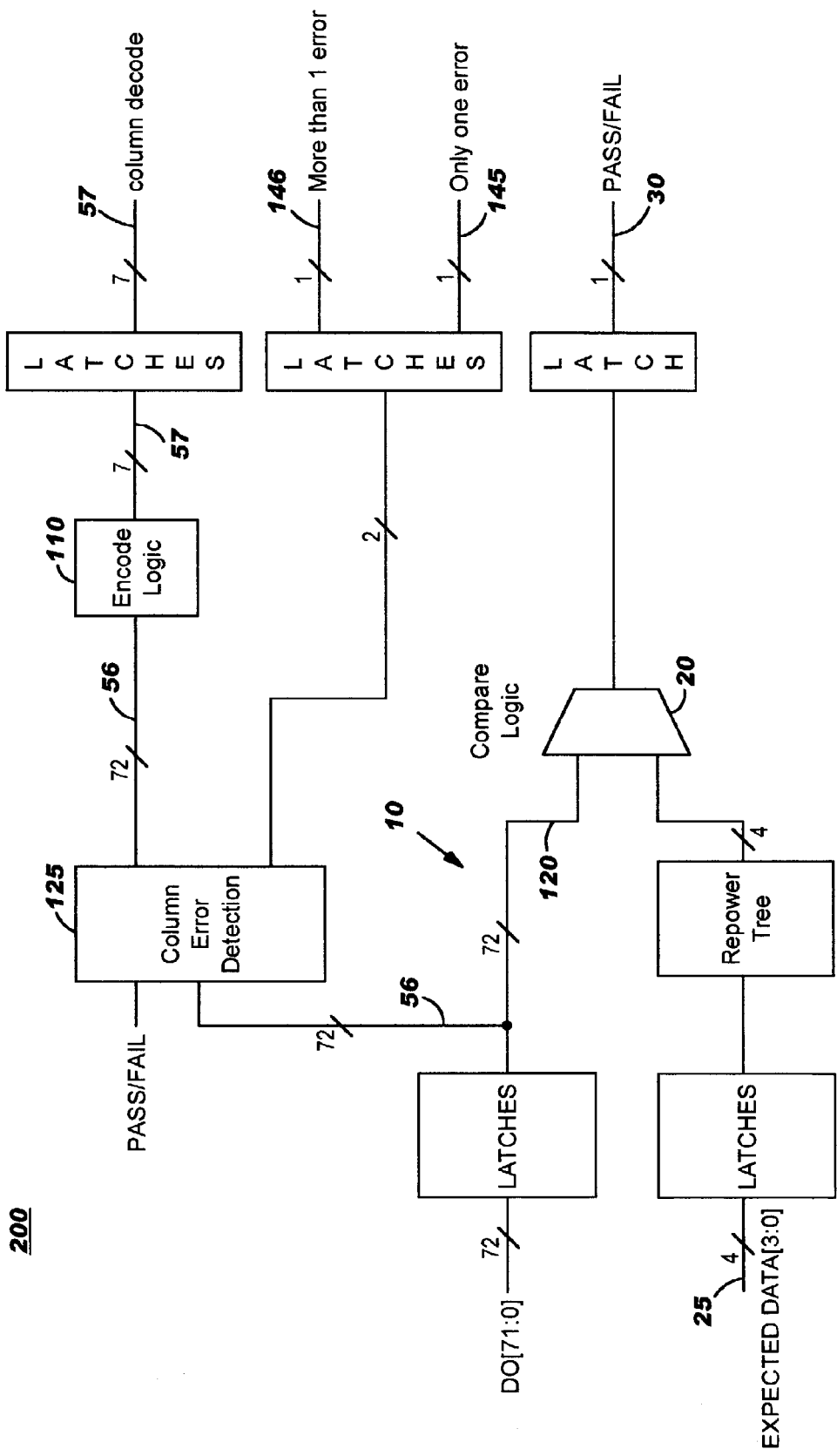
FIG. 6 illustrates an example high-level schematic 200 comprising the two dimension column/row redundancy system 100' for a memory implementing BIST; and, FIG. 7 illustrates an improved ailed address register 250 that works with the fail encoder 110 and greater-than-one fail detector 125 according to the invention.

FIG. 6 illustrates an example high-level schematic 200 comprising the two dimension column/row redundancy system 100' for a memory implementing BIST. As shown in FIG. 6, the system 100' implements the pass/fail compare circuit 20 for row redundancy (of FIG. 1) whereby all 72 bits (representing bit values at columns 0–71) of a row are read out of the memory and input into the pass/fail compare circuit 20, on a per row iterative basis, for the BIST comparison with the expected data 25 for that row. The process is repeated for each row, such that, at each iteration, all the 72 bits read out of a row of memory is compared with the expected data, one row at a time. In one embodiment, as shown in FIG. 6, at each iteration, four (4) bits of the row 27 may be successively read out of a memory row eighteen (18) times, to total 72 bits in the example described. As mentioned, a pass/fail indicator 30 will be set to indicate to the BIST detection of a failed memory (row failure). Simultaneously, when an error is detected in a row, the pass/fail indicator 30 is input to the column error detection circuit (greater-than-one fail detect circuit 125) to detect which one of the bits failed, i.e., which column in the failed row, and initiate encoding of the column location. For an error detected in a failed row, the corresponding column location is known as that failed bit 56 (of 72 bits read out of the pass/fail circuit) is automatically set for input to the column error detect circuit and the encode logic circuit 110 and processed in the manner as described herein. The encoded column value 57 is latched prior to output for potential corrective action depending upon the amount of errors.

Normally, with systems implementing row redundancy, the failing row address is stored in a Failed Address Register ("FAR") located in the BIST. Each time a new fail is encountered a compare is performed within the FAR to see if this is a new fail or one that was already stored. There needs to be one entry per redundant row included in the FAR.

Figure 7:
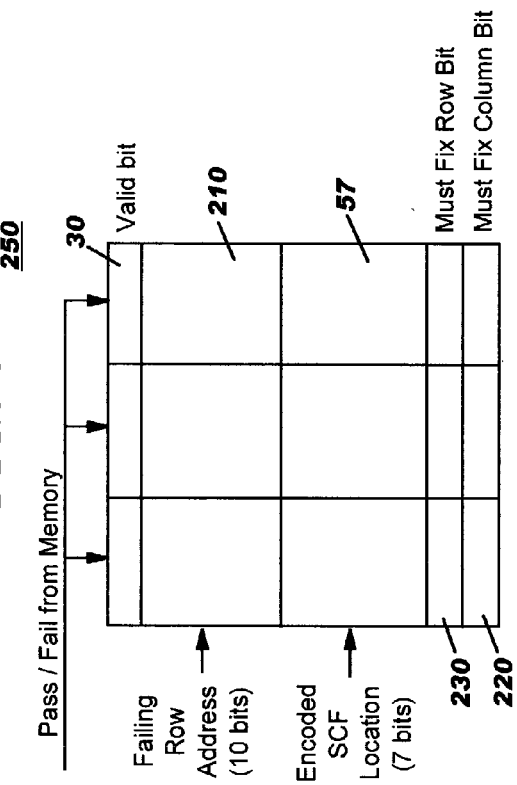

An improved FAR 250 that works with the fail encoder 110 and greater-than-one fail detector 125 is now shown and described with respect to FIG. 7. This FAR 250 is configured to store the pass/fail bit 30, e.g. logic value indicating row failure, the corresponding row address 210 that failed, and the corresponding encoded SCF location, e.g., indicating failed column 57 which is the 7-bit encoded value in the example implementation described. It is preferred that the encoded value is stored rather than the column address. Thus, when a SCF is detected, the failing row, encode value and valid bit of the FAR are set by the BIST engine. If another SCF with the same encode value (i.e., failure at the same column, different row) is detected, then the must-fix column bit 220 indicated in the FAR is set by the BIST engine. If a greater-than-one fail is detected, then the must-fix row bit 230 is set. If there are SCFs detected during test and no must-fix determination is made by the end of test then either row or column replacement may be utilized, depending on what is left. The example FAR shown in FIG. 7 is illustrated for a memory with 1024 rows (10 bits), 16:1 column decode, 72 bits per data word, two rows of redundancy, and one column (I/O) of redundancy. A smaller FAR may be employed with slightly less redundancy-calculation flexibility if only one entry's set of encoding latches are included and only two entry's set of row latches.

A similar arrangement is possible with two redundant columns (I/O) by just having another FAR entry for the second redundant column. This would assume that two data bits within a single word would not fail and be replaced by two columns. The likelihood of this type defect is small enough that there would only be a trivial number of memories which would be fixable that wouldn't be handled by these defects. If these defects were desired to be handled, then a greater-than-2 detect would be required along with two encoder circuits. Those skilled artisans, given the encoder and greater-than-one detect redundancy circuits in the two-dimensional redundancy scheme according to the invention, would be able to design a proper BIST with redundancy handling.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

What is claimed is:

1. A Built In Self Test (BIST) circuit for testing memory in an integrated circuit, said integrated circuit implementing a row and column redundancy calculation for enabling replacement of a defective row or column of memory cells, the BIST circuit comprising:

means for testing rows comprising memory cells in said memory and for detecting for a first single memory cell failure in a row;

encoder device for determining a bit location of a first single memory cell failed and storing an encoded value representing said bit location of said failed memory cell;

means for detecting whether more than one single cell failure has occurred for a tested row, and, in response to detecting more than one single cell failure for said tested row, said means generating a bit indicating that row as a defective row to be replaced; and, means for comparing said encoded value of said location determined for a failed memory cell detected in a subsequent tested row, with said stored encoded value associated with said first single memory cell failed, said means generating a bit indicating defective column to be replaced when said encoded bit value location for a failed memory cell of that subsequent row is equal to said stored encoded value associated with said first single memory cell failed, whereby given the indication of defective bits set, the defective column corresponding to the encoded bit location of the detected failed memory cell and the defective row of memory is replaced.

2. The BIST circuit as claimed in claim 1, wherein said encoded bit location corresponds to a column of memory cells in said memory.

3. The BIST circuit as claimed in claim 1, whereby if no more than a first single cell failure has occurred for a tested row and no bit indicating a defective column to be replaced has been set, then either the row or column including to that first single memory cell failure is replaced.

4. The BIST circuit as claimed in claim 1, further including a failed address register device for storing an address location of a row including said detected failed memory cell indicated for row replacement.

5. The BIST circuit as claimed in claim 4, wherein said failed address register device further stores said encoded bit value location for a failed memory cell of that row.

6. The BIST circuit as claimed in claim 5, wherein said failed address register further stores said bit indicating a defective column to be replaced and said bit indicating a defective row to be replaced.

7. A method for testing memory in an integrated circuit implementing a row and column redundancy calculation for enabling replacement of a defective row or column of memory cells, the method comprising the steps of:
   a) testing a row of memory cells in said memory for detecting a first single memory cell failure in a row;
   b) determining a bit location of said first single memory cell failed, and storing an encoded value representing said bit location of said failed memory cell;
   c) detecting whether more than one single cell failure has occurred for a tested row, and, in response to detecting more than one single cell failure has occurred for a said row, generating a bit indicating that row as a defective row to be replaced;
   d) for each subsequent row tested, in response to detection of a failed memory cell for a subsequent row, comparing said encoded bit value location for a failed memory cell of that subsequent tested row with said stored encoded value associated with said first single memory cell; and
   e) generating a bit indicating defective column to be replaced when said encoded bit value location for a failed memory cell of that subsequent row is equal to said stored encoded value associated with said first single memory cell, and
   f) replacing said defective column corresponding to the encoded bit location of the detected failed memory cell and replacing the defective row of said memory when corresponding defective bits are set.

8. The method as claimed in claim 7, wherein said encoded bit location corresponds to a column of memory cells in said memory.

9. The method as claimed in claim 7, whereby if no more than said first single cell failure has occurred for a tested row as determined in step c) and no bit indicating defective column to be replaced has been set, then step f) includes the step of utilizing a either row or column replacement for that determined first single memory cell failure.

10. The method as claimed in claim 7, further including the step of storing an address location of a row including said detected failed memory cell for said row redundancy in a failed address register.

11. The method as claimed in claim 10, further including the step of storing said encoded bit value location for a failed memory cell of that row in said failed address register.

12. The method as claimed in claim 7, further including the step of storing said bit indicating a defective column to be replaced and said bit indicating a defective row to be replaced in said failed address register.

13. An apparatus for testing a memory and implementing redundancy with built-in self-test (BIST) wherein said redundancy includes at least one spare row and at least one spare column, said memory with BIST comprising:
   means for calculating a fail bit encode value corresponding to a detected failed memory cell; and
   a greater-than-one detect circuit for determining if more than one cell has failed a particular row tested, wherein said BIST utilizes said fail bit encode value when column redundancy is to be implemented.

* * * * *